United States Patent [19]
O'Connor

[11] Patent Number: 5,541,874
[45] Date of Patent: Jul. 30, 1996

[54] SEMICONDUCTOR-INTEGRATED-CIRCUIT SRAM-CELL ARRAY WITH SINGLE-ENDED CURRENT-SENSING

[75] Inventor: Kevin J. O'Connor, Lebanon, N.J.

[73] Assignee: AT&T Corp., Murray Hill, N.J.

[21] Appl. No.: 522,796

[22] Filed: Sep. 1, 1995

Related U.S. Application Data

[63] Continuation of Ser. No. 250,746, May 27, 1994, abandoned.

[51] Int. Cl.$^6$ ........................................... G11C 11/40
[52] U.S. Cl. .............................. 365/156; 365/189.04
[58] Field of Search ................................. 365/154, 156, 365/189.04, 190, 226, 230.05, 51

[56] References Cited

U.S. PATENT DOCUMENTS 5,282,174  1/1994  Little ................................ 365/189.04
5,321,658  6/1994  Ishimura et al. ........................ 365/226

Primary Examiner—A. Zarabian
Attorney, Agent, or Firm—David I. Caplan; Bruce S. Schneider

[57] ABSTRACT

Each memory cell in an SRAM array contains an auxiliary reading transistor connected across one of the transistors in each cell. A row read line controls the ON-OFF condition of this auxiliary reading transistor. In addition, each cell has two access transistors for connecting the cell to complementary column bit lines The ON-OFF condition of both of these access transistors is controlled by a row write line. Each cell has two power nodes, one connected to a power source such as VDD and the other connected to a column detector line that terminates in a current sensor. The state of the memory cell is sensed by this current sensor. In one embodiment, the power line that brings the voltage VDD to the cells is a column line; in another embodiment, it is a row line. Thus there are a total of four column lines and two row lines in the one embodiment, and a total of three column lines and three row lines in the other embodiment.

17 Claims, 2 Drawing Sheets

SEMICONDUCTOR-INTEGRATED-CIRCUIT SRAM-CELL ARRAY WITH SINGLE-ENDED CURRENT-SENSING

This application is a continuation of application Ser. No. 08/250,746, filed on May 27, 1994 now abandoned.

FIELD OF INVENTION

This invention relates to semiconductor-integrated-circuit memory circuitry and more particularly to semiconductor static random access memory ("SRAM") cell cross-point arrays—i.e., arrays of cells in which each of the cells is located at a crossing of a row line with a column line.

BACKGROUND OF INVENTION

A semiconductor-integrated-circuit SRAM cell is a memory cell, in the form of electrical circuitry integrated in a semiconductor body, that retains its binary digital memory storage state (i.e., a 0 or a 1: a low or a high) for as long a time as dc electrical power is applied to the cell or until it is written again with a different binary digital signal (i.e., a 1 or a 0, respectively). In one design, such a cell is formed by a pair of cross-coupled transistors, each of the transistors being connected in series with a separate load device. Each of these load devices can simply be a resistor such as provided by suitably connected transistor (diode). In another design, such a cell is formed by electrical circuitry comprising two pairs of cross-coupled transistors connected in series with each other—one pair comprising a pair of cross-coupled n-channel MOS (Metal Oxide Semiconductor) transistors, and the other pair comprising a pair of cross-coupled p-channel MOS transistors. In any event, the semiconductor body in which a cross-point memory array is integrated is typically silicon, but it is known that similar arrays can be constructed in other semiconductor bodies such as compound Group III-V semiconductors like GaAs (gallium arsenide).

An array of SRAM cells can take the form of one or more columns of SRAM cells in which each such cell is located at (and is electrically connected at) an intersection of a single (electrically conductive) row line with a single (electrically conductive) column line B. Each such row line carries an electrical signal, whereby (during any read-write cycle) it can select which desired row of the cells shall be written or read. The determination of whether a cell, which is thus selected by the row line, shall be written versus shall be read during a given read-write cycle is made by external circuitry connected to the (electrically conductive) column line B.

External electrical access either for reading or for writing desired cells—for example, simultaneous access to as many as all the cells located on a selected row of cells—is desired in such arrays. Access transistors intervene between the column lines and the cells—one or more such access transistors per cell—to control the flow of the data (0's and 1's) between the column lines and external sense (detector) circuitry and external data-source circuitry, and thus to control the selection by the row lines of the cells that are to be written or are to be read More specifically, in order to facilitate the writing (at various moments of time) of either a 0 and a 1 state into a cell, at least two access transistors per cell is desirable, whereby each column of cells requires at least two column lines (e.g.., a pair of complementary column bit lines typically labeled B and $\overline{B}$). At any moment of time, one of these column lines carries the opposite digital signal (if any) from the other. In addition, each cell requires electrical power, such as is provided by a column VDD line and a column VSS line, where VDD is typically in the approximate range of 1 volt to 5 volt, and where VSS is typically ground (0 volt).

In some practical applications of SRAM cell arrays, a capability of reading one cell located on a given column and simultaneously (i.e., during a single read-write cycle) writing another cell located on the same given column is desirable: this capability allows a desirably faster overall performance. This capability will be referred to as a "simultaneous read-write" capability.

To this end, a paper by H. Kadota et al published in *IEEE Journal of Solid-State Circuits*, Vol. SC-17, pp. 892–897 (1982) and entitled "A New Register-File Structure for the High-Speed Microprocessor" teaches circuitry for accessing an SRAM cross-point-memory-cell array. Also, a paper by Kevin J. O'Connor published in IEEE Journal of Solid-State Circuits, Vol. SC-22, pp. 712–719 (1987) and entitled "The Twin-Port Memory Cell" teaches [at FIG. 2(*b*)] circuitry for accessing such an array. The circuitry taught in those papers involved arrays of "dual-port" SRAM cells—i.e., SRAM cells in which electrical access to (and hence selection of) each cell is provided by four column lines per column of cells (a pair of column lines located on either side of the cell) while each column line of a given pair carried the opposite binary digital signal from the other. In addition, access to (and hence selection of) each cell located on a given row was controlled by a pair of row lines (one such pair for each such row of cells): one of the pair controlled the reading while the other of the pair independently controlled the writing of the cells located on the row. Detection of the 0 vs. 1 memory state of a selected cell was accomplished by means of a voltage sensing device, such as an amplifier and flip-flop circuitry. Such dual-port cells, when located in an array having more than a single row, thus achieved the above-mentioned simultaneous read-write capability. In addition, such dual port cells (as a result of being dual port, i.e., having two pairs of column bit lines associated with each cell) enjoyed the advantage of not requiring boosted (higher-applied-voltage) row lines.

The circuitry taught in the above-described prior art, however, required a total of four column lines plus two column power lines for each column of cells, in addition to two row lines, whereby an undesirable amount of added precious semiconductor area was needed to accommodate the total of six column lines plus the two row lines. It would therefore be desirable to an SRAM cross-point-memory-cell array having fewer than six column lines per column of cells while retaining the above-mentioned read-write capability.

SUMMARY OF INVENTION

This invention provides electrical circuitry arrangement including a semiconductor integrated circuit SRAM array, that has the capability of reading one cell while writing another cell on the same column. Advantageously each SRAM cell in the array comprises a pair of cross-coupled n-channel MOS (NMOS) transistors connected in series with a pair of cross-coupled p-channel MOS (PMOS) transistors. The circuitry arrangement of this invention, however, requires a total of only four column lines and two row lines, or requires a total of only three column lines and three row lines, for the array of cells. The array may have only a single column. Rather than rely on voltage sensing, the circuitry arrangement of this invention relies on single-ended current sensing. Such current sensing advantageously can be provided by a separate current sensing device connected to each column. Each such current sensing device serves the function of sensing the memory state of the selected cell located on the column to which the current-sensing device is connected. Moreover, each SRAM cell has an added auxiliary transistor connected across one of the transistors in the cell. Each such auxiliary transistor has a control terminal connected to a row read-line (RR) that selects which of the rows of cells shall be read during any read-write cycle. Moreover, a row write-line (RW) selects which of the rows of cells shall be written during any read-write cycle.

In a specific embodiment, the invention-comprises semiconductor integrated circuitry that includes:

(a) a row-column array including a plurality of SRAM cells integrated in a semiconductor body, each of the cells having separate first and second power terminals and separate first and second access transistors, each of the access transistors having a pair of high current carrying terminals and a control terminal, the plurality including first and second SRAM cells located at an intersection of first and second rows, respectively, with a first column;

(b) first and second electrically conductive column lines located adjacent to the first column, a first and a second output terminal of each of the first and second SRAM cells being connected to the first and second column lines, respectively, through the high current carrying terminals of the first and second access transistors, respectively, of the first and second cells, respectively;

(c) a first pair of electrically conductive row lines located adjacent to the first row, and a second pair of electrically conductive row lines located adjacent to the second row;

(d) first and second electrical conductors connecting one of the row lines of the first and second pairs of row lines to the control terminals of both of the access transistors of the first and second cells, respectively;

(e) first and second power lines connected to the first and second power terminals, respectively, of both of the cells; and (f) first and second auxiliary transistors located in the first and second cells, respectively, and having a control terminal that is separately connected to the other row line of the first and second pairs, respectively, and having first and second high current carrying terminals respectively connected to the first power line and the first output terminal of the first and second cells, respectively.

Advantageously a current sensing device is connected to the second power line, and a power source (typically labeled VDD) is connected to the first power line.

In this way, a total of only four column lines and two row lines are required or, in the alternative a total of only three column lines and three row lines are required.

DETAILED DESCRIPTION

Figure 1:
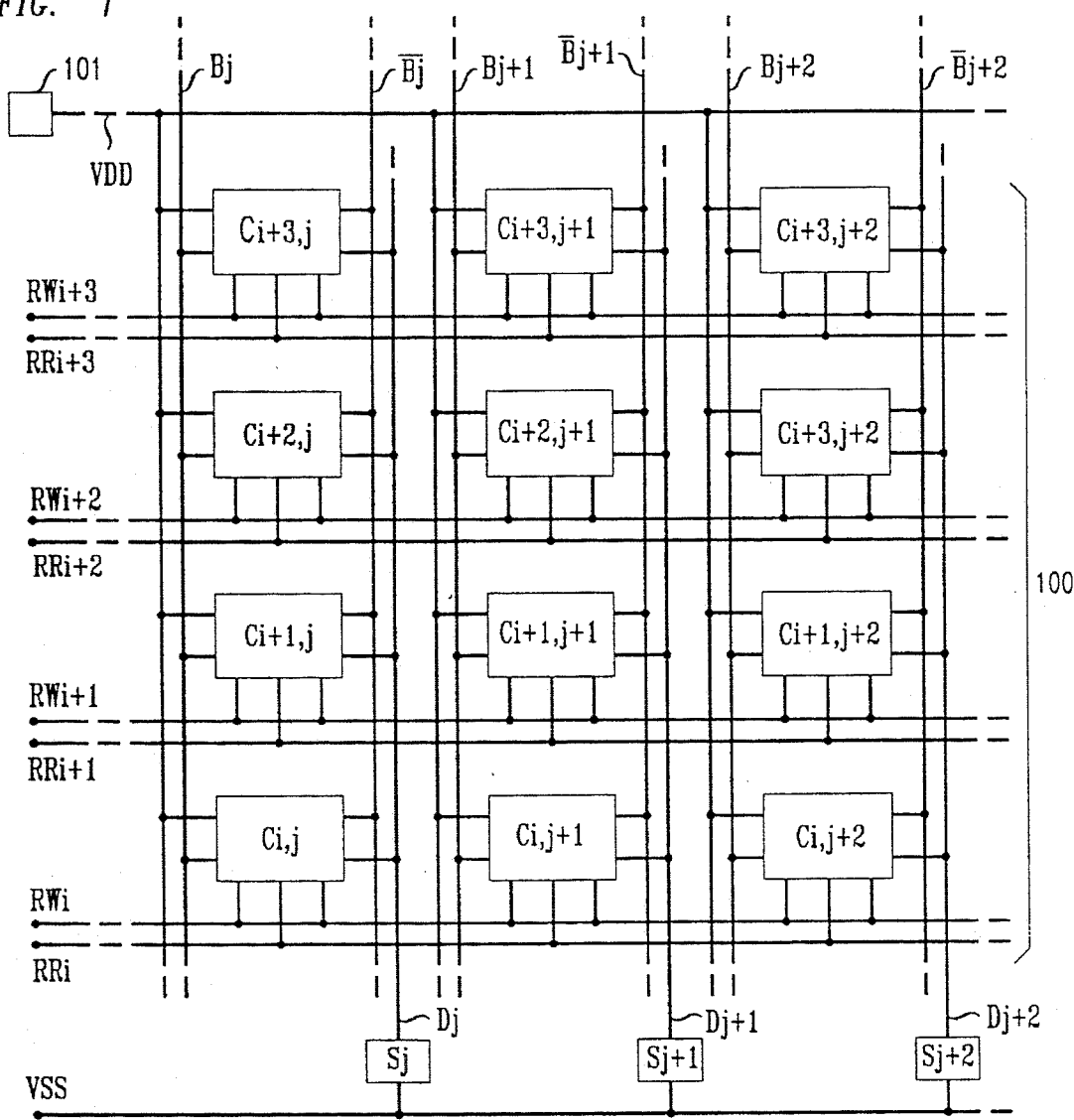
FIG. 1 is a block diagram of SRAM integrated circuitry with single-ended electrical current sensing, according to a specific embodiment of the invention.

As indicated in FIG. 1, SRAM circuitry with single-ended electrical sensing comprises an array 100 of SRAM cells, labeled Ci,j and so forth. The first index i refers to the row; the second index j, to the column. The array may contain only a single column of cells. All cells have the same internal construction (FIG. 2) and typically are integrated in a silicon semiconductor chip, as known in the art.

Figure 2:
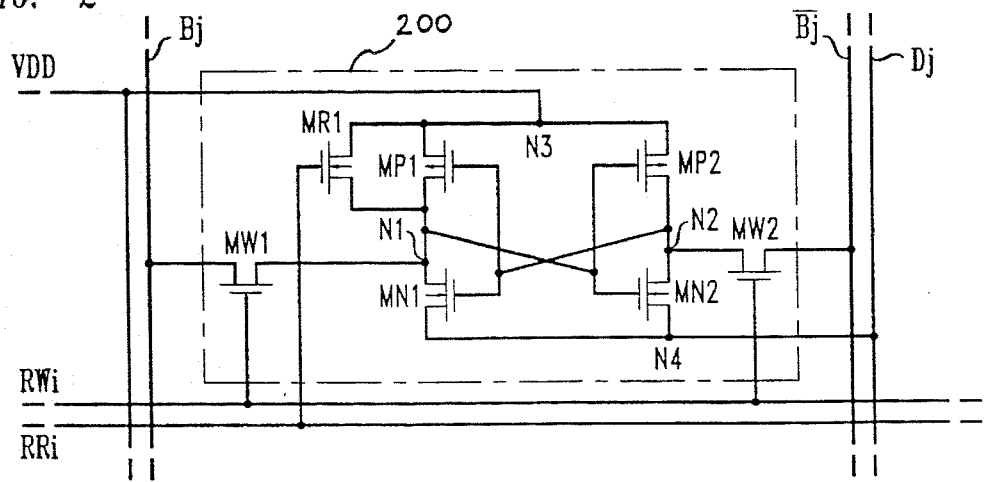
FIG. 2 is a circuit schematic of an SRAM cell that can be used in the block diagram of FIG. 1, according to a specific embodiment of the invention.

More specifically, as shown in FIG. 2, the (illustrative) cell 200 (which is identical to a cell like Ci,j) has a pair of cross coupled NMOS transistors MN1 and MN2 respectively connected in series with a pair of cross-coupled PMOS transistors MP1 and MP2, as known in the art. Output terminals (or "nodes") N1 and N2 are respectively located between the transistors MN1 and MP1 and between the transistors MN2 and MP2. Access NMOS transistors MW1 and MW2 respectively connect, via their respective high-current-carrying terminals, the output nodes N1 and N2 to complementary column bit lines Bj and $\overline{B}j$, as known in the art. A row write line RWi is separately connected to a control terminal (gate electrode) of each of the access transistors MW1 and MW2, as known in the art. One end of a column power line VDD is connected to a voltage source 101, as known in the art; another end is connected to a node N3. This node N3 is connected to one of a pair of high-current-carrying terminals of both the transistors MP1 and MP2, as known in the art. A node N4 connects together the other of the pair of high-carrying terminals of the transistors MN1 and MN2, also as known in the art.

A row read line RRi is connected to a control-terminal of an auxiliary reading-transistor MR1. A pair of high-current-carrying terminals of this reading-transistor MR1 connects the node N3 to the node N1 (alternatively to the node N2). Finally the node N4 is connected to a column detector line Dj that terminates in an electrical current sensor Sj (FIG. 1), advantageously only one such current sensor Sj per column. Each such current sensor Sj typically can take the form of a current sense amplifier comprising (not shown) a resistor with a voltmeter connected across it. The voltmeter advantageously comprises a CMOS flip-flop detector, arranged to form a current sense amplifier with input level shifting as known in the art. In any event, the resistance of the resistor is advantageously significantly lower than that of the voltmeter, so that the RC time constant of the current sensor is suitably low. On the other hand, the resistance of the auxiliary transistor MR1 is sufficiently high, so as not to draw undue amounts of current from the power line VDD and hence so as not to cause undue amounts of power consumption.

As known in the art, during electrical operations the cell 200 can have two memory states: in the one state MP1 is OFF, MN1 is ON, MP2 is ON, and MN2 is OFF; in the other state MP1 is ON, MN1 is OFF, MP2 is OFF, and MN2 is ON. The purpose of the auxiliary reading transistor MR1 is to provide a desired low-resistance current path from VDD to the detector line Dj (and hence to the current sensor Sj) via the cell 200 if and only if the cell 200 is in the one memory state but not in the other memory state. More simply, the auxiliary reading transistor MR1 provides a low-resistance path from the node N3 to the node N4 if and only if the cell is in the one memory state but not in the other.

More specifically, if the cell 200 is in the memory state in which MP1 is OFF and MN1 is ON (MP2 is ON and MN2 is OFF), then if is desired to read the cell 200, a HIGH level signal is applied to the write the row read line RRi to turn ON the auxiliary reading transistor MR1—whereby a low resistance path through the cell 200 exists through MR1 and MN1, so that the current sensor Sj will indicate a HIGH current. On the other hand, if the cell 200 is in the memory state in which MP1 is ON and MN1 is OFF (MP2 is OFF and MN2 is OFF), then even if the auxiliary transistor MR1 is turned ON, no such low resistance path through the cell 200 can exist: if MN1 is OFF, since MP2 is then necessarily OFF (owing to the cross-coupling connections of the transistors in the cell 200) there is therefore no way such a low-resistance path can exist. Thus the auxiliary reading transistor MR1 indeed serves to enable reading of the cell 200.

On the other hand, writing of the cell 200 is accomplished as in prior art: a HIGH level signal is applied to the row write line RWi, whereby the access transistors MW1 and MW2 are turned ON so that the column bit lines Bj and $\overline{Bj}$ can be connected to the nodes N1 and N2, respectively, in order to write the cell 200, as known in the art. Moreover, if desired, one cell on a given column can be written while another cell on the same column can be read: for example, a cell such as Ci,j can be written while a cell such as Ci+2,j can simultaneously (i.e., during a single read-write cycle) be read.

In order to implement such a simultaneous writing of one cell and reading of another cell (both cells located on the j'th column)—specifically to write the cell Ci,j and to read the cell Ci+2,j—a HIGH level signal is applied to the row write line RWi while a HIGH level signal is applied to the row read line RRi+ 2. At the same time, a LOW level signal is applied to all the other row read and row write lines. In this way, insofar as the j'th column is concerned, only the cell Ci,j can be written (by means of complementary HIGH or LOW signals applied to the column bit lines Bj and $\overline{Bj}$, respectively, depending upon the desired memory state to be written), and at the same time only the cell Ci+2,j can be read because of the low-resistance path from VDD to the detector line Dj and thus to the current sensor Sj through the cell Ci+2,j (i.e., from the node N3 to the node N4). However, no such low-resistance path will then exist through any other cell located on the j'th column, as is desired for reading one cell without having another cell delivering a confusing current signal.

As indicated in FIG. 1, between adjacent cells located on a given row, the row read line RRi and the*row write line RWi are parallel. Between adjacent cells located on a given column, the power line VDD and the column-detector line Dj are parallel to the column bit lines Bj and $\overline{Bj}$. In this way, the circuitry shown in FIG. 1 entails a total of four (electrically conductive) column lines (VDD, Bj, $\overline{Bj}$, Dj) per column and two (electrically conductive) row lines (RWi, RRi) per row.

Figure 3:
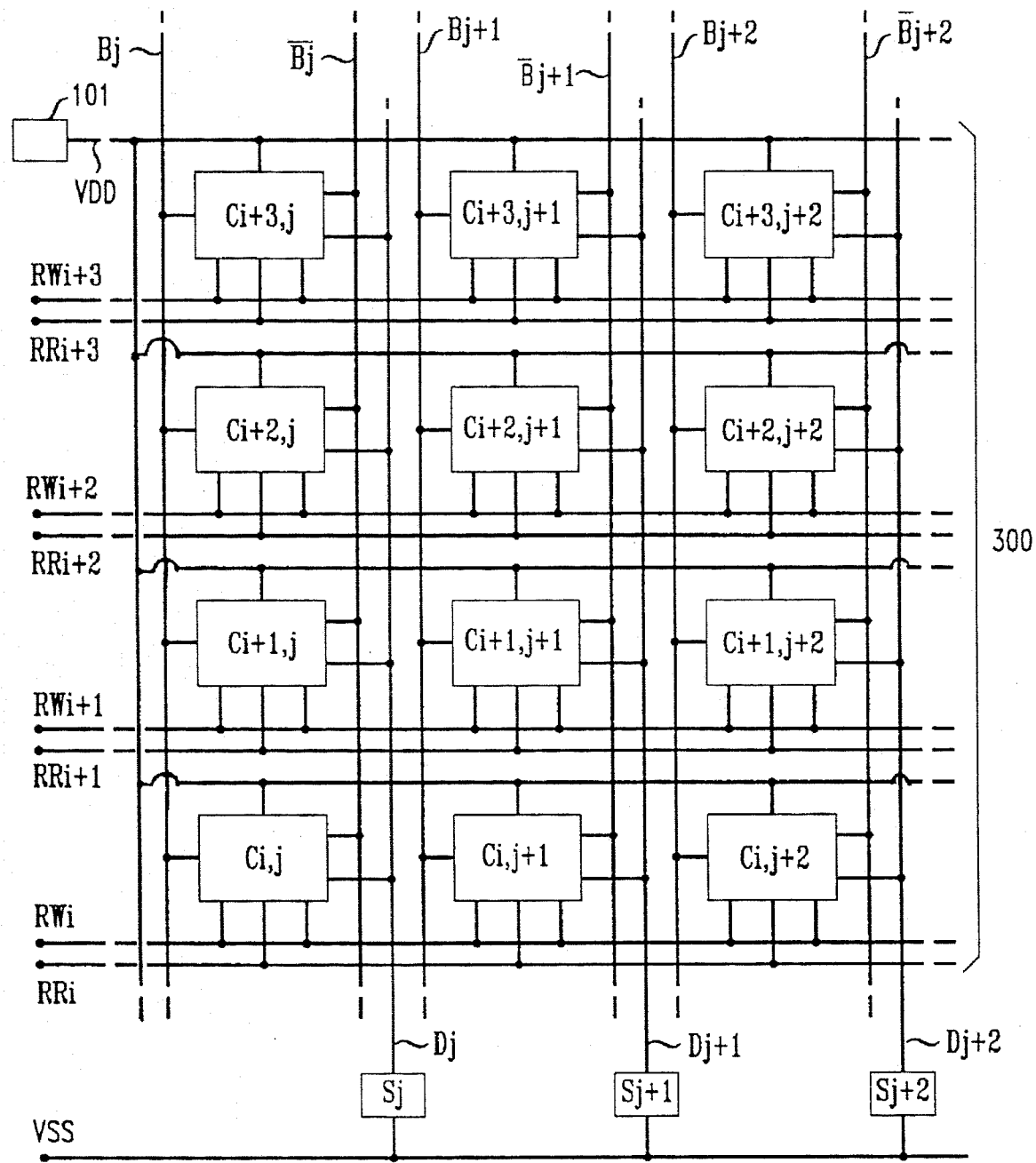
FIG. 3 is a block diagram of SRAM integrated circuitry with single-ended electrical current sensing, in accordance with another specific embodiment of the invention.

In accordance with another specific embodiment of the invention, in an array 300 (FIG. 3) the same cells Ci,j et cetera are used as were used in the circuitry 100 shown in FIG. 1. On the other hand, the power line VDD is arranged such that, between adjacent cells, it runs parallel to the row lines RWi and RRi rather than parallel to the column lines Bj and $\overline{Bj}$. In this way, as indicated in FIG. 3, the circuitry can be arranged so that there are a total of three column lines (Bj, $\overline{Bj}$, Dj) per column and three row lines (VDD, RWi, RRi) per row.

Although the invention has been described in detail with reference to specific embodiments, various modifications can be made without departing from the scope of the invention. For example, instead of being an NMOS transistor the auxiliary reading transistor MR1 can be a PMOS transistor. Instead of being connected across the transistor MP1, the transistor MR1 can be connected across the transistor MN1, MP2, or MN2. Instead of more than two rows, there can be as few as two rows, and instead of more than one column there can be as few as only a single column—whereby, during a single read-write cycle, the cell located on the one row can be written while the cell located on the other row can be read. Also, instead of the cross-coupled PMOS transistors MP1 and MP2, resistive load devices can be used such as thin film resistors or polysilicon resistors, provided that they have sufficiently high resistance so that the current flowing through them is significantly smaller than the current flowing through the auxiliary reading transistor MR1 in its ON condition.

I claim:

1. Semiconductor integrated circuitry comprising:
   (a) a row-column array including a plurality of SRAM cells integrated in a semiconductor body, each of the cells having a separate first power terminal, a separate detector terminal, and ,separate first and second access transistors, each of the access transistors having a pair of high current carrying terminals and a control terminal, the plurality including first and second SRAM cells located at an intersection of first and second rows, respectively, with a first column;
   (b) first and second electrically conductive column lines located adjacent to the first column, a first and a second output terminal of each of the first and second SRAM cells being connected to the first and second column lines, respectively, through the high current carrying terminals of the first and second access transistors, respectively, of the first and second cells, respectively;
   (c) a first pair of electrically conductive row lines located adjacent to the first row, and a second pair of electrically conductive row lines located adjacent to the second row;
   (d) first and second electrical conductors connecting one of the row lines of the first and second pairs of row lines to the control terminals of both of the access transistors of the first and second cells, respectively;
   (e) a power line connected to the power terminal of both of the cells;
   (f) first and second auxiliary transistors located in the first and second cells, respectively, and having a control terminal that is separately connected to the other row line of the first and second pairs, respectively, and having first and second high current carrying terminals respectively connected to the power line and to the first output terminal of the first and second cells, respectively; and
   (g) a current sensing device having a pair of terminals, one of which is connected to each of the detector terminals of the plurality of the cells and the other of which is connected to a second power terminal.

2. Circuitry according to claim 1 in which each of the cells comprises a pair of cross-coupled transistor drivers that are separately connected in series with a separate load device.

3. Circuitry according to claim 1 in which the power line runs essentially parallel to the first and second column lines.

4. Circuitry according to claim 3 further comprising a current sensing device connected to the second power line.

5. Circuitry according to claim 4 in which each of the cells comprises a pair of cross-coupled transistor drivers that are separately connected in series with a separate load device.

6. Circuitry according to claim 4 in which each of the cells comprises a pair of cross-coupled n-channel transistors separately connected in series with a pair of cross-coupled p-channel transistors.

7. Circuitry according to claim 6 in which the n-channel transistors are NMOS transistors, the p-channel transistors are PMOS transistors, the auxiliary transistor is an NMOS transistor, and the first power terminal is connected to a high current carrying terminal of both of the PMOS transistors.

8. Circuitry according to claim 7 further comprising a power source connected to the power line.

9. Circuitry according to claim 6 further comprising a power source connected to the power line.

10. Circuitry according to claim 5 further comprising a power source connected to the power line.

11. Circuitry according to claim 4 further comprising a power source connected to the power line.

12. Circuitry according to claim 3 further comprising a power source connected to the power line.

13. Circuitry according to claim 1 or 2 further comprising a power source connected to the power line.

14. Circuitry according to claim 1 or 2 in which between the first and second cells the power line runs essentially parallel to the row lines.

15. Circuitry according to claim 14 further comprising a power source connected to the power line.

16. Circuitry according to claim 1 in which the detector line runs, within the array, essentially parallel to the row lines.

17. Circuitry according to claim 16 further comprising a current sensing device connected to the second power line.

* * * * *